United States Patent
Kuo

(12) United States Patent (10) Patent No.: US 7,320,115 B2
Kuo (45) Date of Patent: Jan. 15, 2008

(54) METHOD FOR IDENTIFYING A PHYSICAL FAILURE LOCATION ON AN INTEGRATED CIRCUIT

(75) Inventor: Feng-Ming Kuo, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 296 days.

(21) Appl. No.: 11/180,743

(22) Filed: Jul. 12, 2005

(65) Prior Publication Data

US 2007/0016879 A1    Jan. 18, 2007

(51) Int. Cl.
G06F 17/50 (2006.01)
G06F 19/00 (2006.01)
G06F 11/07 (2006.01)
G01R 31/28 (2006.01)
G01R 31/08 (2006.01)

(52) U.S. Cl. .......................... 716/4; 700/108; 714/714; 714/30; 714/37; 324/501; 324/527

(58) Field of Classification Search .................... 716/4; 700/108; 714/724, 30, 37; 324/501, 527
See application file for complete search history.

(56) References Cited

U.S. PATENT DOCUMENTS

| | | | | |
|---|---|---|---|---|
| 5,202,639 A * | 4/1993 | McKeon et al. | ............. | 324/537 |
| 5,231,589 A * | 7/1993 | Itoh et al. | ...................... | 716/12 |
| 5,544,088 A * | 8/1996 | Aubertine et al. | ............. | 716/13 |
| 6,594,590 B2 * | 7/2003 | Woods et al. | .................. | 702/35 |
| 6,697,981 B2 * | 2/2004 | Shigeta | ......................... | 714/736 |
| 7,272,764 B2 * | 9/2007 | Rich et al. | .................. | 714/733 |
| 2001/0011360 A1 * | 8/2001 | Shigeta | ......................... | 714/724 |
| 2002/0087940 A1 * | 7/2002 | Greidinger et al. | ............ | 716/2 |
| 2002/0184605 A1 * | 12/2002 | Matsuoka | ........................ | 716/4 |
| 2003/0056163 A1 * | 3/2003 | Rajsuman et al. | .......... | 714/724 |

* cited by examiner

Primary Examiner—Phallaka Kik
(74) Attorney, Agent, or Firm—K & L Gates LLP

(57) ABSTRACT

A method is disclosed for identifying a physical failure location on an IC without using layout-versus-schematic (LVS) verification tool. In the method, the integrated circuit is tested with one or more test patterns to identify a failure port thereon. Hierarchical information of the failure port is generated through the test patterns. A physical location of the failure port in a layout of the integrated circuit is identified through a relation between the hierarchical information and a floor plan report. Layout information of a routing path associated with the physical location of the failure port is retrieved from a layout database.

24 Claims, 7 Drawing Sheets

METHOD FOR IDENTIFYING A PHYSICAL FAILURE LOCATION ON AN INTEGRATED CIRCUIT

BACKGROUND

The present invention relates generally to the semiconductor integrated circuit (IC) chip design and fabrication, and more particularly to identifying and locating IC failures without using any layout versus schematic (LVS) verification tool.

New IC creation is an extremely time-consuming, labor-intensive, and costly endeavor. The IC creation process can be divided into the IC design/verification stage and the IC fabrication/test stage. Previously, many integrated device manufacturers (IDMs) designed and manufactured their new ICs within their own company plants and fabrication facilities (fabs). However, as the cost of building and operating the fabs have spiraled upward, many of these IDMs have eliminated their own fabs and utilized "pure play" foundries to fabricate their IC designs. These companies are now known as fabless IC companies. Foundries run multiple fabless companies IC designs in their fabs using their own internally developed fabrication processes.

There are several advantages with respect to the fabless business model. For example, the startup of a fabless IC company requires only a relatively modest investment in computer aided design (CAD) systems. The cost of a typical state-of-the-art fab now exceeds $2 billion. The fabless IC company reaps the benefits of manufacturing economies of scale. The fabless IC company can focus its efforts on its area of the greatest expertise, product definition, design, and development.

Although the fabless business model has many advantages, there are pitfalls as well. For example, the design handoff information from the fabless IC company or IDM to the circuit manufacturer is very complex. All pertinent fabrication, test, and troubleshoot information need to be available to the circuit manufacturer to quickly resolve technical issues to minimize the turnaround time. Although this is desirable, in reality, the fabless IC company only supplies the minimum necessary data to the circuit manufacturer to protect its proprietary design information.

Also, the fabless company or IDM typically utilizes a "Layout versus Schematic" (LVS) tool for verification of the entire IC design prior to its handoff to the circuit manufacturer for fabrication. The LVS testing is an essential step in IC design and validates the consistency between the logical view (schematic or netlist) versus the physical view (layout or masking polygon). Various LVS tool suites are available to the fabless IC companies from CAD vendors. The fabless IC company or IDM can therefore run their selected LVS tools. The resultant database created from the LVS verification step is then utilized by the fabless IC company and IDM to associate the logical netlist information to the physical layout database of the IC.

Today's deep sub-micron geometries ICs, such as the system on a chip (SOC) designs, contain more than a million gates as well as multiple functional blocks (SRAM, PLL, analog converters, etc). As such, the LVS verification on today's ICs requires tremendous computing resources, extensive test time, and technical resources to perform the verification.

For the circuit manufacturer, these LVS results may not be accessible due to the proprietary information the LVS results contain. Only limited mask tooling information (physical view) is available to the circuit manufacturer. Also, the complete netlist information created for the IC design also may not be available to the circuit manufacturer due to its proprietary nature.

Therefore, desirable in the art of IC fabrication for a circuit manufacturer are alternative methods to identify and locate IC failures after IC fabrication without using any LVS verification tool information for minimizing the IC fabrication turnaround time.

SUMMARY

In view of the foregoing, this invention provides a method and system for identifying a physical failure location on an IC without using LVS verification tools. In one embodiment, the method includes the following steps. The integrated circuit is tested with one or more test patterns to identify a failure port thereon. Hierarchical information of the failure port is generated through the test patterns. A physical location of the failure port in a layout of the integrated circuit is identified through a relation between the hierarchical information and a floor plan report. Layout information of a routing path associated with the physical location of the failure port is retrieved from a layout database.

DESCRIPTION

Figure 1:
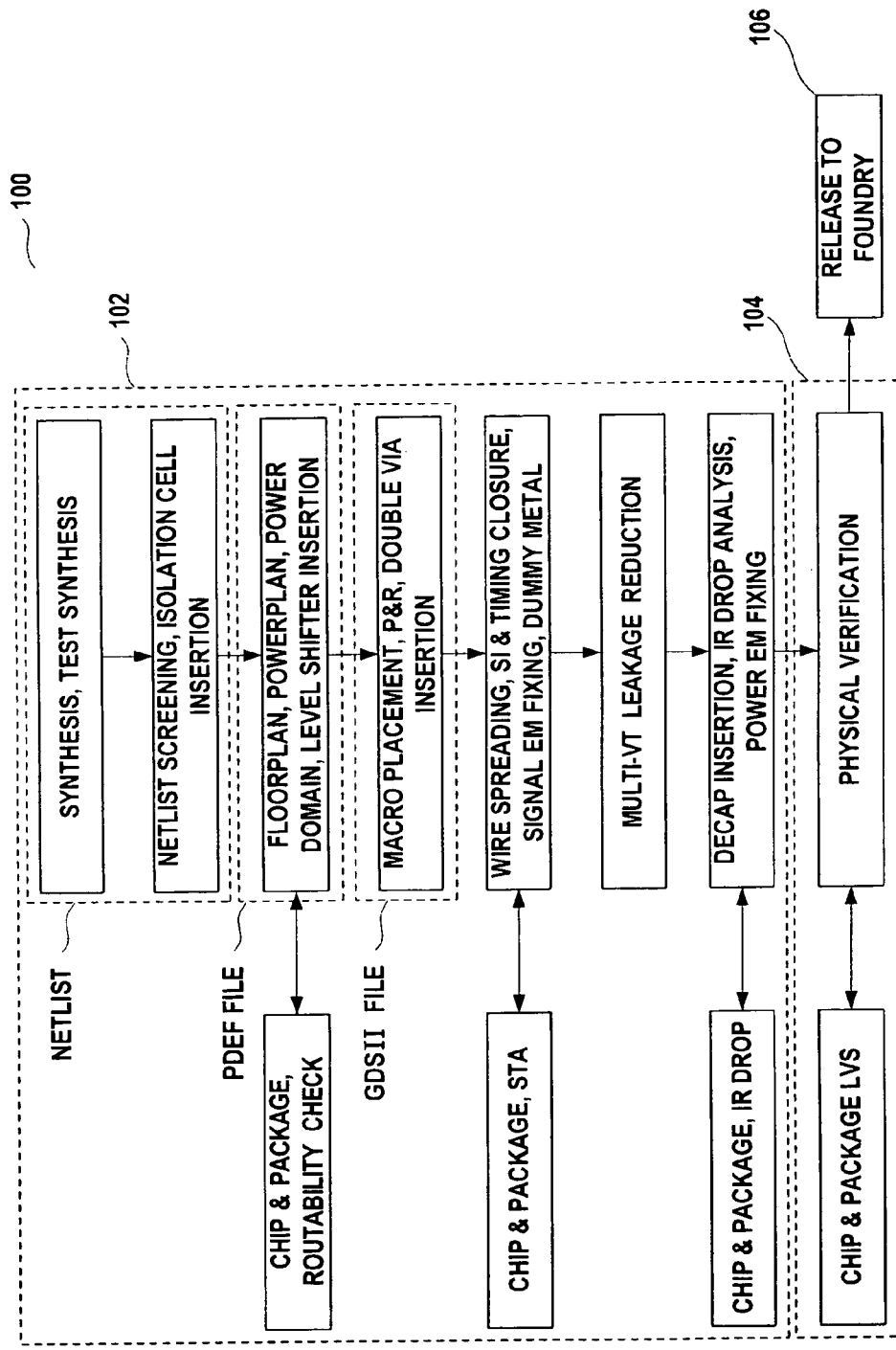
FIG. 1 presents a conventional IC design flow at a fabless IC company or IDM.

FIG. 1 presents a conventional IC design flow 100 at an IC fabless company or IDM. The IC design flow 100 can be generally divided into an IC design step 102 and an IC design verification step 104. The design step 102 starts with the IC design specification synthesized into a high level software language, such as HDL. A netlist is created to correspond to the IC electrical design for use in the layout of the IC using CAD tools. The floor plan showing the layout of the circuits within the IC is started along with the power and ground physical layouts. A chip and package routability check is performed to insure that all necessary electrical routing can be implemented. The floor plan may be saved as a physical design exchange format (PDEF) file format. A place-and-route (P&R) process determines the location of the components, electrical routing, and via locations. A static timing analysis (STA) is performed on the IC chip and package to insure proper timing, wire routing and minimal electrical migration (EM) effects. Multi-Vt gate leakage effects are analyzed and reduced, where possible. In addition, IR drop and decoupling capacitance for the chip are analyzed and modified as necessary. In addition, power electro-migration modifications are implemented.

After the initial IC design process has been completed, the verification step 104 of the entire IC design begins. The fabless company or IDM utilizes a LVS tool for verification of the entire IC design prior to handoff to the circuit manufacturer for fabrication. The LVS testing is an essential step in IC design to validate the consistency between the logical view (schematic or netlist) versus the physical view (layout or masking polygon). Various LVS tool suites are available to the fabless IC companies from computer aided design (CAD) vendors. The fabless IC company or IDM can therefore run their selected LVS tools. The resultant database created from the LVS verification step is utilized by the fabless IC company and IDM to associate the logical netlist information to the physical layout database of the IC. The LVS verification on today's ICs requires tremendous computing resources, extensive test time, and technical resources to perform the verification. In the typical IC design process flow 100, a process 106 releases the IC design to the circuit manufacturer after the LVS testing has been completed.

Figure 2:
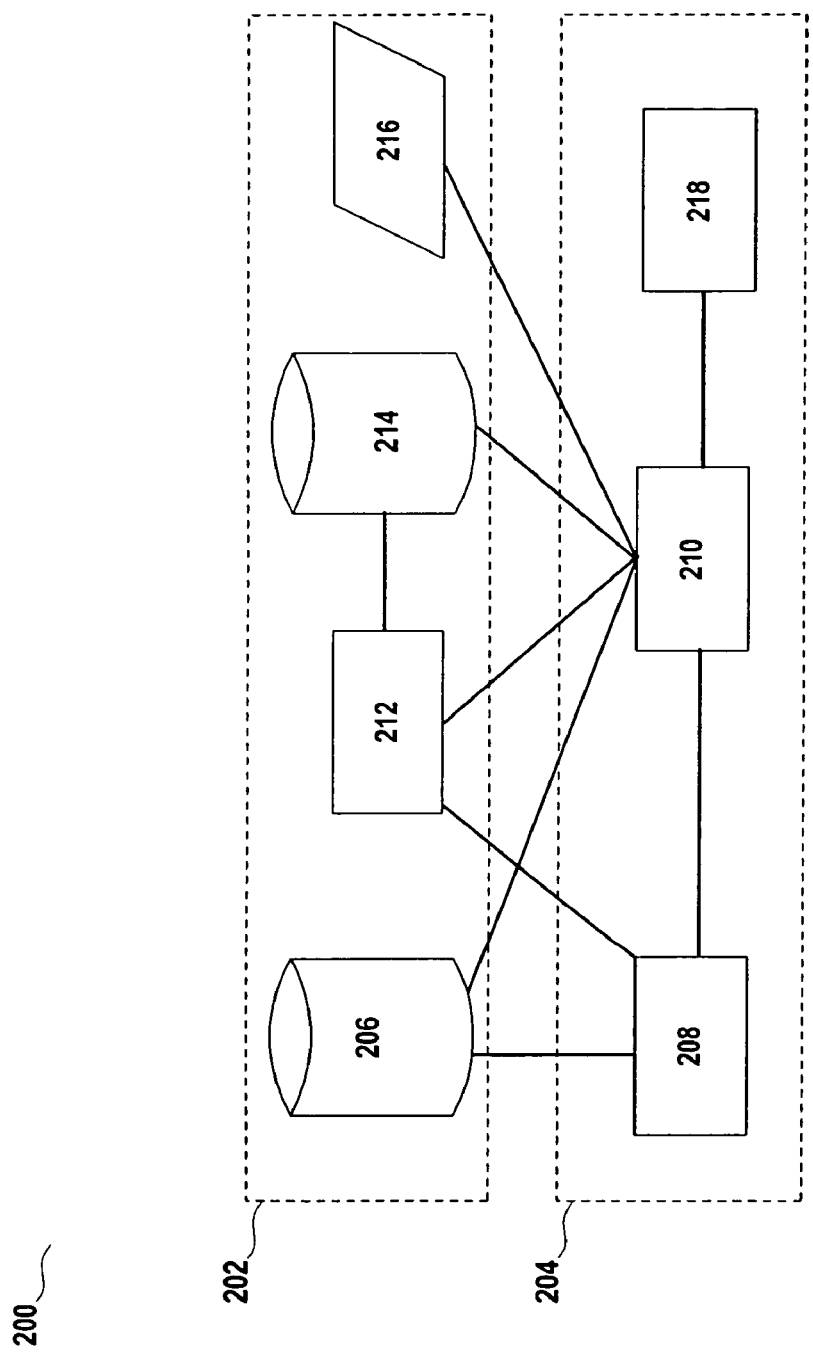
FIG. 2 presents a conventional IC fabrication documentation flow between a fabless IC company and a circuit manufacturer.

FIG. 2 presents a conventional IC fabrication documentation flow 200 between a fabless IC company and a circuit manufacturer. A group 202 indicates the databases generated by the fabless company, while a group 204 represents the circuit manufacturer operation that utilizes this information. The fabless IC company or IDM generates a GDSII formatted graphical IC layout database 206 from the P&R process for a fabrication/test step 208, as well as a failure diagnostic process 210. A test program 212 is used by the circuit manufacturer for both the fabrication/test step 208 and the failure diagnostics process 210. An automatic test pattern generation (ATPG) database 214 contributes the test vectors required to produce high fault coverage test patterns for an IC design and is used in the failure diagnostic process 210. A netlist 216 is a textual file representing an IC design as a set of library-specific cells and their interconnections. The netlist 216 is typically proprietary information of the fabless IC company and as such not transferred to the circuit manufacturer. However, PDEF files, which are representative of the netlist, may be generated by the floor planner software in the conventional IC design flow 100 and may be transferred to the circuit manufacturer for IC diagnosis. A process 218 stores the failure circuit and location in the layout generated by the failure diagnostic process 210. It is noted that the diagnostic process 210 only provides pictures showing the physical failures in formats, such as scanning electron microscope (SEM), transmission electron microscope (TEM) and Emmi.

Figure 3:
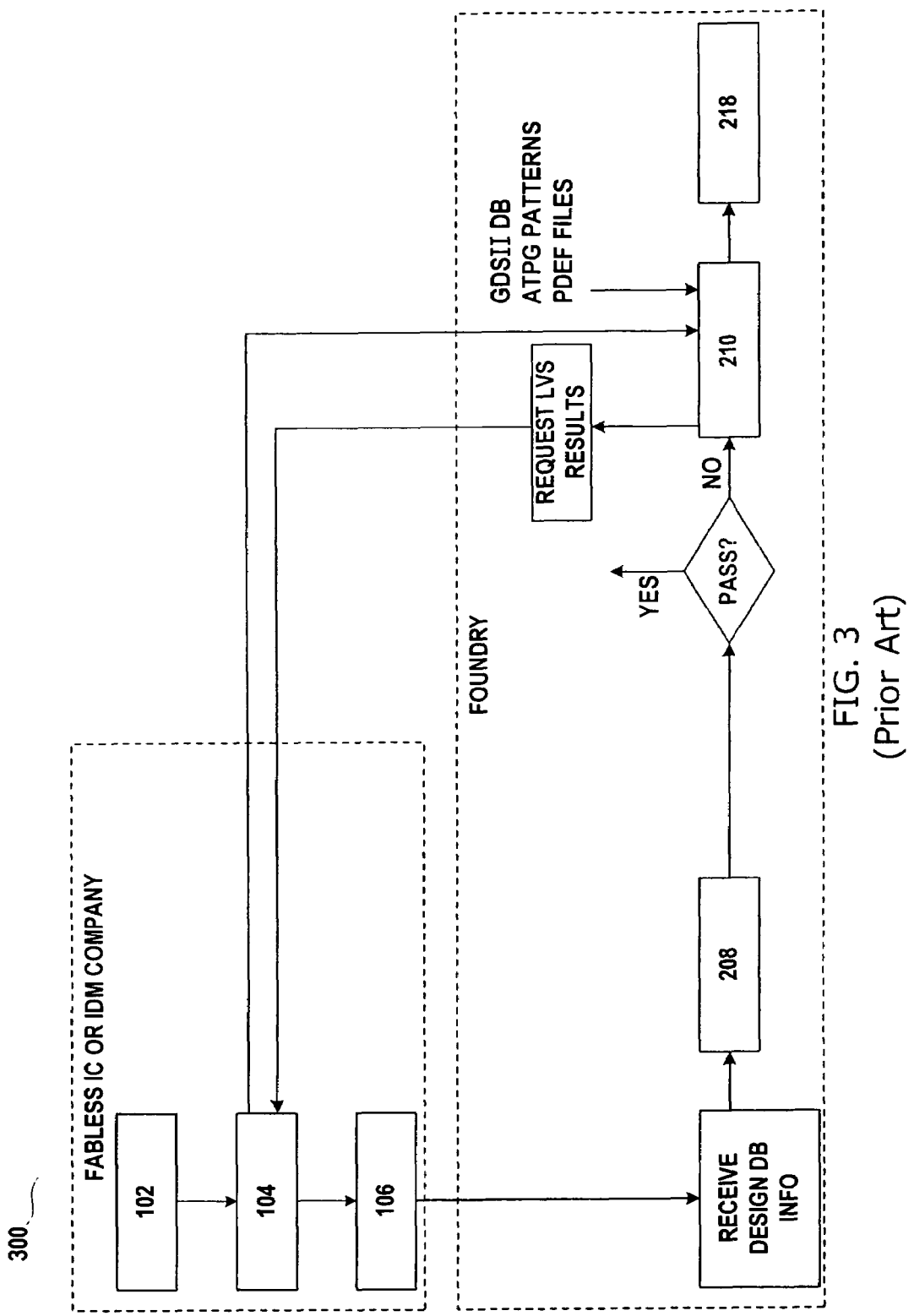
FIG. 3 presents a conventional IC fabrication and test process flow at a circuit manufacturer.

FIG. 3 presents a conventional IC fabrication and test process flow 300 at a circuit manufacturer. The IC is designed using the design step 102, which generates the required databases for the circuit manufacturer. The LVS verification testing is then performed in the IC design verification step 104, thereby verifying the electrical design (e.g., logical view) against the physical design (e.g., physical view). The required design database documentation necessary for IC fabrication and test is then sent to the circuit manufacturer at the process 106. The typical information sent to the circuit manufacturer includes the GDSII DB, a test program, ATPG patterns, and a PDEF file. The circuit manufacturer utilizes these databases to fabricate and test the ICs in the fabrication/test step 208. Devices that fail the fabrication/test step 208 have the failure diagnostic process 210 performed to identify and locate the failed device and location. This conventional diagnostic testing utilizes the typical databases received from the fabless IC company (GDSII, ATPG, and PDEF files) as well as LVS data results, which are required to identify and isolate the failure in the process 218. As previously explained, LVS testing is extremely time consuming, requiring extensive computer resources and labor. The requirement to use the LVS test results for circuit diagnostic testing has significant adverse impact to the device turnaround time.

Figure 4:
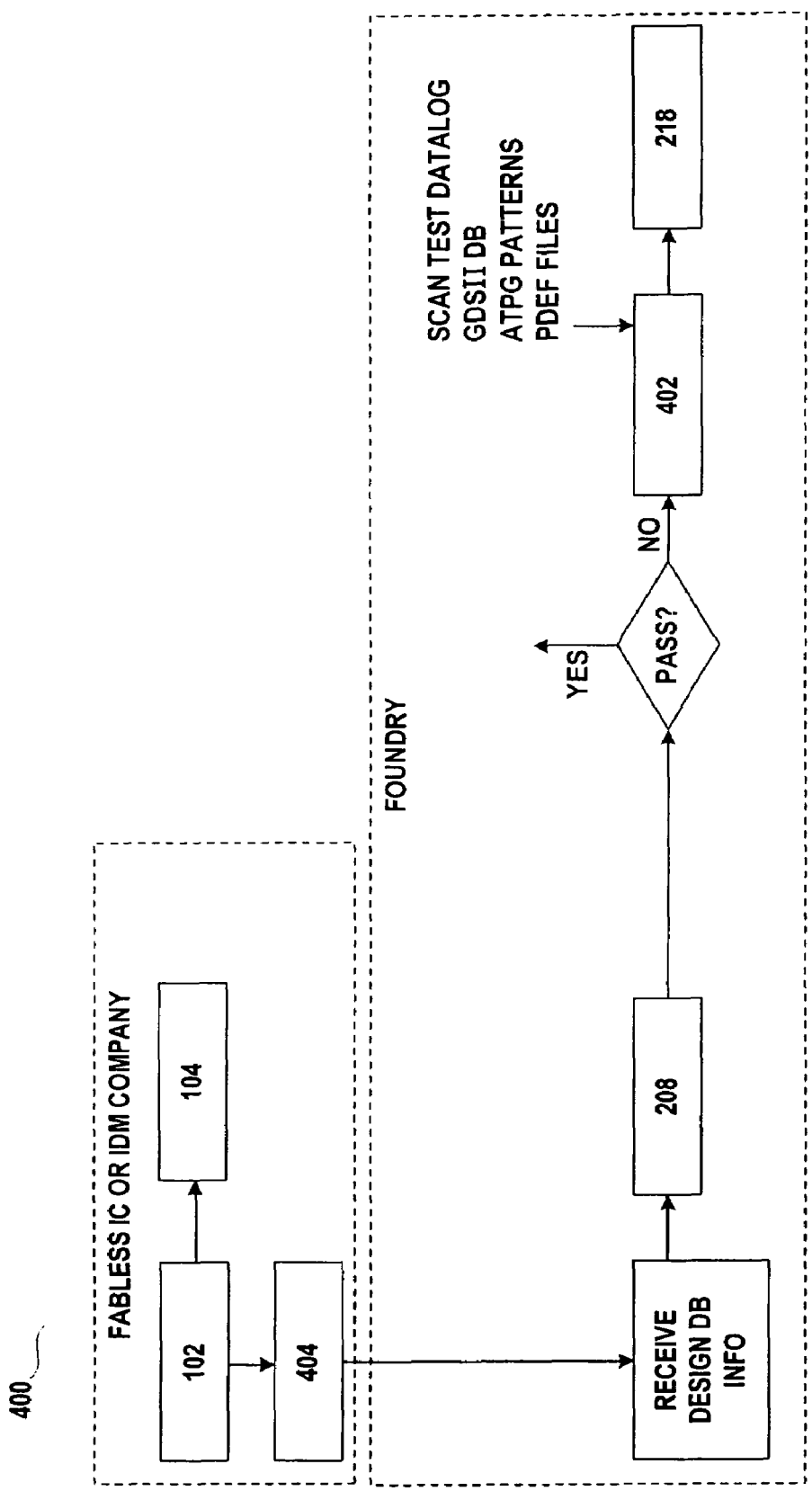
FIG. 4 presents an IC fabrication and test process flow at the circuit manufacturer, in accordance with one embodiment of the present invention.

FIG. 4 presents a new IC fabrication and test process flow 400 at the circuit manufacturer, in accordance with one embodiment of the present invention. In the test process flow 400, a scan diagnostics testing process 402 utilizes various ATPG test patterns in conjunction with the scan test data log, GDS II files, and PDEF files to identify and locate IC failures. Since the new IC fabrication and test process flow 400 does not utilize LVS test results to isolate the IC test errors, the device turnaround time is significantly reduced. The LVS testing results are not required for the circuit manufacturer operation.

This new IC fabrication and test process flow 400 utilizes the IC design step 102. The IC design verification step 104 may be performed for purposes of the circuit manufacturer diagnostic testing. Thereafter, the databases generated during the IC design step 102 are sent directly to the circuit manufacturer in a process 404. The fabrication/test step 208 completes the flow.

When a device fails the fabrication/test step 208, the scan diagnostics testing process 402 is performed in lieu of the conventional failure diagnostic process 210 as shown in FIG. 3. The scan diagnostics testing process 402 utilizes the ATPG patterns with the scan test data log from the fabrication/test step 208, as well as the GDS II files, and PDEF files to identify/locate the device failure in the process 218.

Figure 5:
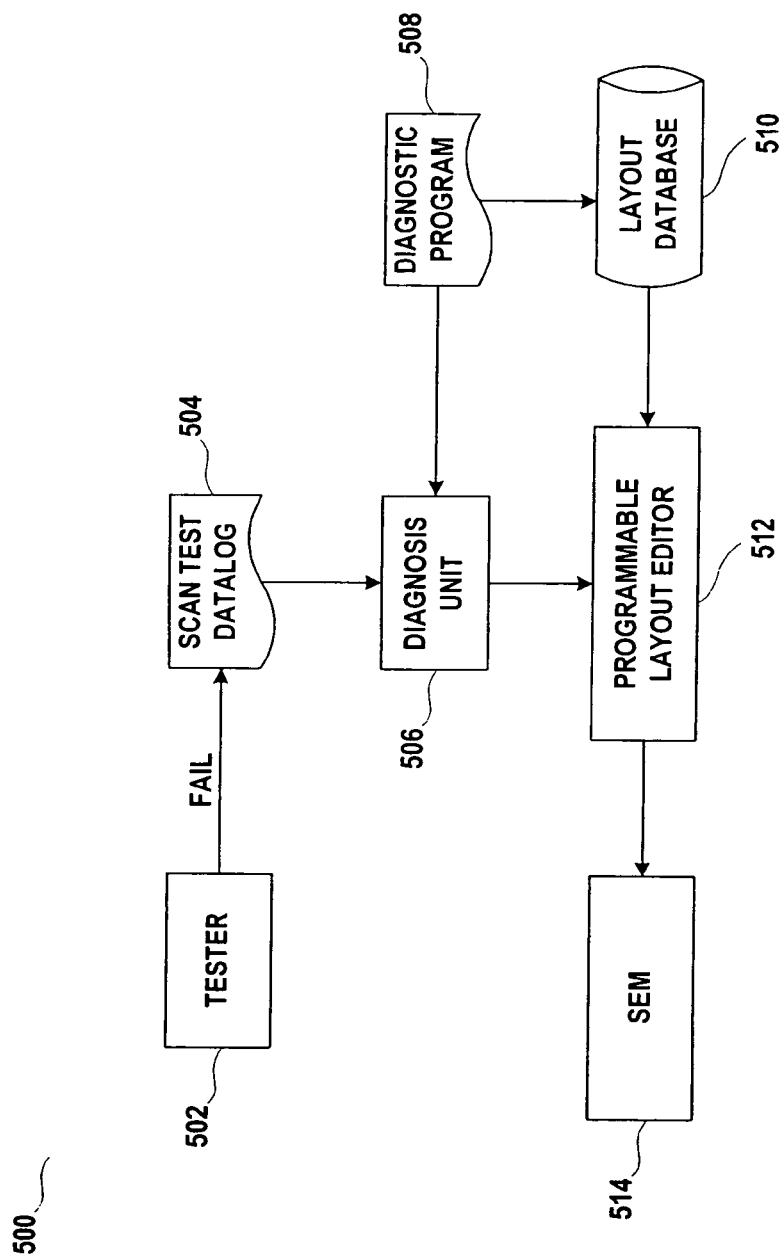
FIG. 5 presents a system for a circuit manufacturer to identify a physical failure location on an IC, in accordance with one embodiment of the present invention.

FIG. 5 presents a system 500 for a circuit manufacturer to identify a physical failure location on an IC without using LVD test results, in accordance with one embodiment of the present invention. An IC is tested at a tester 502 for identifying the failure ports therein. A predetermined test pattern is input into the IC to produce a scan test data log 504 indicating at least one failure cycle of the test pattern with regard to at least one pin of the IC. The failed IC is further diagnosed with a diagnosis unit 506 installed with diagnostic programs 508, such as an automatic test pattern generation (ATPG) program. The diagnosis unit 506 derives hierarchical information with regard to the failure port from the scan test data log 504. For example, a diagnosis unit 506 installed with an ATPG program can generate a pin path, a kind of hierarchical information, such as TP/NAND2/A, without using coordinates, wherein TP represents a certain block, NAND2 represents a certain gate, and A represents a certain port.

The hierarchical information is then forwarded to a programmable layout editor 512 supported by a layout database 510, which includes, for example a floor plan report and a polygonal layout information. The floor plan may be saved in a file format, including, but not limited to, a physical design exchange format (PDEF), library exchange format (LEF) or design exchange format (DEF). The physical location of the failure port is identified in the circuit layout using the floor plan report, which identifies the relative coordinates (TP_Xxxxx_Yyyyy) of the failure port. For example, the coordinates are inserted into the pin path generated by the ATPG program as TP/NAND2_X_Y/A.

Then, the programmable layout editor 512 traverses the layout database 510 to obtain layout information as to the physical routing of the failure port within the IC. The database transverse is accomplished by applying syntax to a program interpreter of the programmable layout editor 512 to retrieve specific layout information, such as cell names, cell boundaries, polygon coordinates, text, etc. The layout information may be saved in a GDS II format, which stands for geometric data stream. The first layout database traverse goes to specified X/Y coordinates generated through the floor plan report. A list of cells, whose boundaries cover these specified X/Y coordinates, is generated. A standard cell that is on the cell list, is selected according to the hierarchical information for locating the failure port. A routing path and its related information, such as texts and polygonal coordinates, with respect to the failure port are generated. Finally, the failure location is verified by employing an SEM, pictorially. Corrective action to resolve the design issue may be then implemented.

Figure 6:
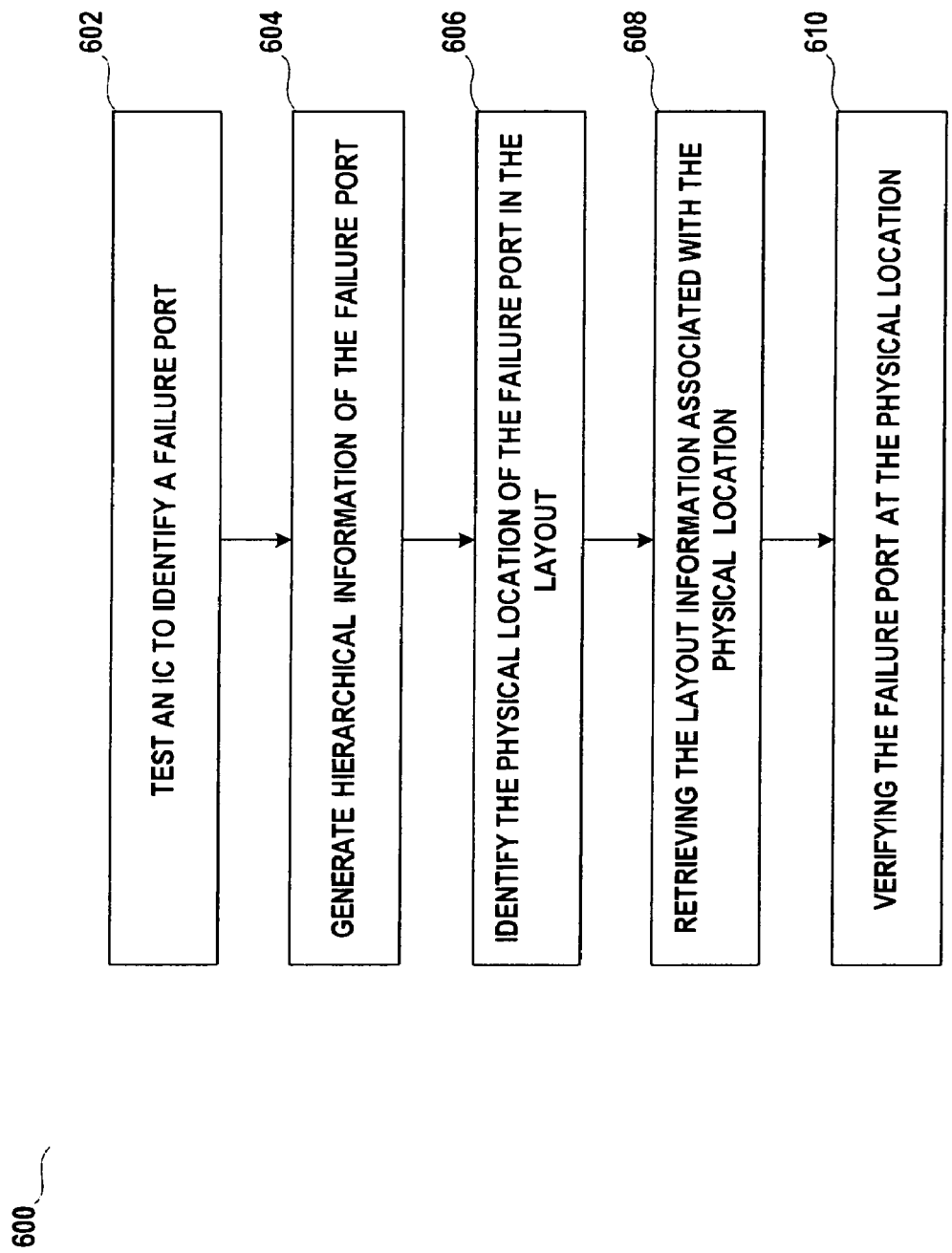
FIG. 6 presents a flow chart of a method for a circuit manufacturer to identify a physical failure location on an IC, in accordance with one embodiment of the present invention.

FIG. 6 illustrates a flow chart 600 that shows a method for identifying a failure port on an IC without using the LVS verification tools, according to an embodiment of the present invention. In step 602, the IC is tested with one or more test patterns to identify a failure port on the IC. The test can be performed by inputting the test pattern into the IC, and outputting a test data log indicating at least one failure cycle of the test pattern with regard to at least one pin of the IC. In step 604, hierarchical information of the failure port is generated through the test patterns. In an embodiment, an automatic test pattern generation (ATPG) program can be used for deriving the hierarchical information, a pin path that specifies a predetermined port of a gate without using coordinates. In step 606, a physical location of the failure port is identified in a layout of the IC through a relation between the hierarchical information and a floor plan report. The floor plan report is searched for coordinates corresponding to the pin path. In step 608, layout information of a routing path associated with the physical location of the failure port is retrieved from a layout database. In step 610, the failure port is verified at the physical location on the integrated circuit by means of, for example, scan electron microscopy.

Figure 7:
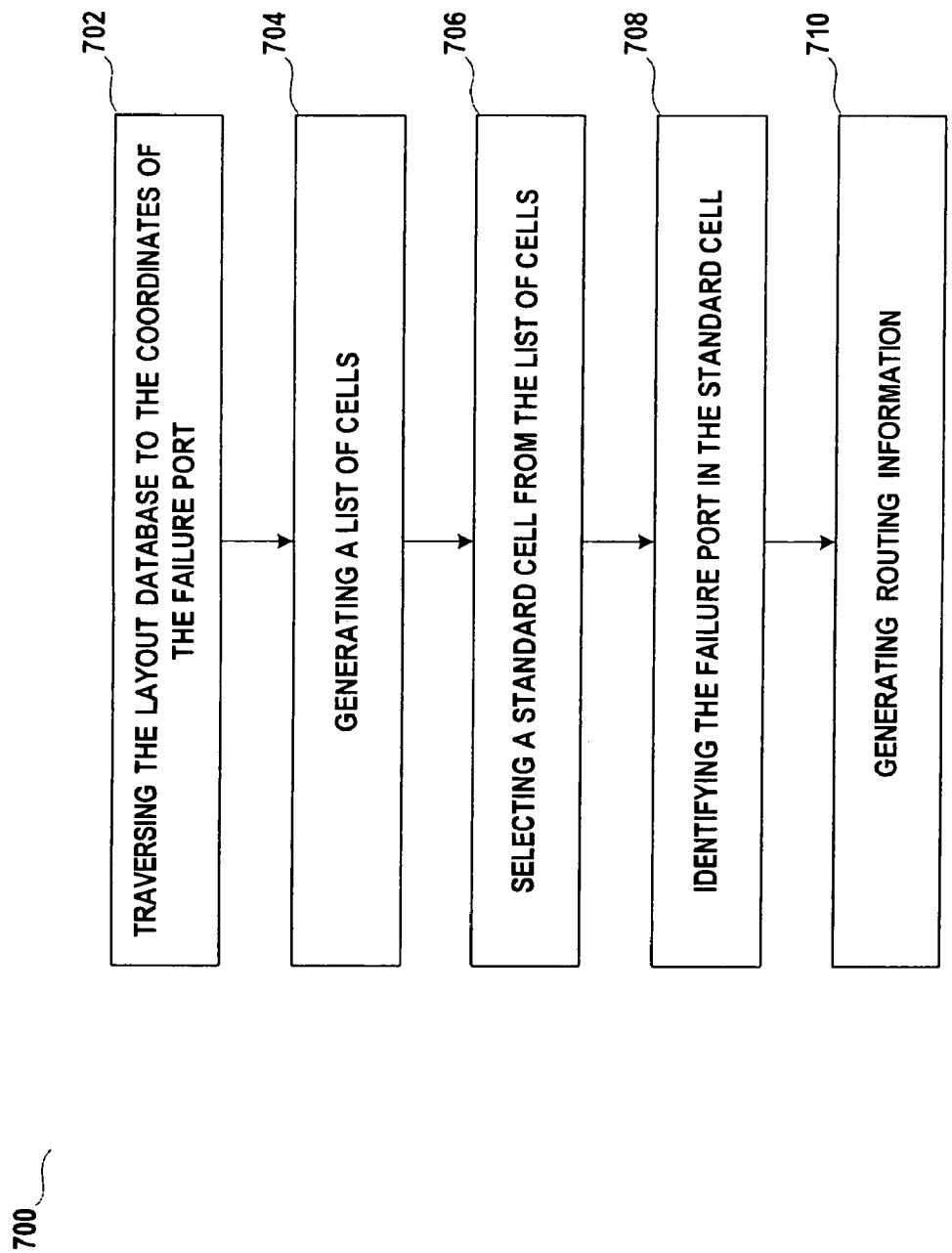
FIG. 7 presents a flow chart detailing the method, in accordance with the embodiment of the present invention.

FIG. 7 illustrates a flow chart 700 detailing the step 608 shown in FIG. 6. In step 702, the layout database is traversed to the coordinates of the physical location in the layout. In step 704, a list of cells, whose boundaries covering the coordinates of the physical location is generated. These cells vary from simple NAND, NOR gates to complex DFF cells. In step 706, a standard cell is selected from the list of cells, according to the hierarchical information. In step 708, the failure port is identified in the standard cell. In step 710, routing information related to the failure port in the layout is generated.

This invention identifies and locates IC failures after IC fabrication without the utilization of the proprietary LVS verification tool. The invention also allows the circuit manufacturer to associate the layout (physical view) to interested portions (test failures) of the design primitives (logical view) with limited information from the IC fabless company to protect its proprietary information and also reduce the circuit manufacturer's IC fabrication turnaround time.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for an integrated circuit manufacturer to identify a physical failure location on an integrated circuit without using layout-versus-schematic verification tools, the method comprising:

testing the integrated circuit with one or more test patterns to identify a failure port thereon;

generating hierarchical information of the failure port through the test patterns;

identifying a physical location of the failure port in a layout of the integrated circuit through a relation between the hierarchical information and a floor plan report; and retrieving layout information of a routing path associated with the physical location of the failure port from a layout database.

2. The method of claim 1 wherein the testing comprises:

inputting the test pattern into the integrated circuit; and outputting a test data log indicating at least one failure cycle of the test pattern.

3. The method of claim 2 wherein the generating hierarchical information comprises using an automatic test pattern generation (ATPG) program for deriving the hierarchical information from the test data log.

4. The method of claim 1 wherein the hierarchical information is a pin path, which specifies a predetermined port of a gate without using coordinates.

5. The method of claim 4 wherein the floor plan report is of physical design exchange format (PDEF), library exchange format (LEF) or design exchange format (DEF).

6. The method of claim 4 wherein the identifying a physical location comprises searching the floor plan report for coordinates of the failure port corresponding to the pin path.

7. The method of claim 6 wherein the retrieving layout information comprises:

traversing the layout database to the corresponding coordinates;

generating a list of cells, whose boundaries covering the corresponding coordinates;

selecting a standard cell from the list of cells containing the failure port, according to the hierarchical information; and generating the routing path related to the failure port in the layout of the integrated circuit.

8. The method of claim 1 wherein the layout database includes at least a file of a GDS II format.

9. The method of claim 1 further comprising verifying the failure port at the physical location on the integrated circuit, using a scanning electron microscope (SEM).

10. A system for associating logical net information with physical layout information for an integrated circuit without using layout-versus-schematic verification tools, the system comprising:

a tester for testing the integrated circuit with one or more test patterns to identify a failure port on the integrated circuit;

a diagnosis unit for generating hierarchical information of the failure port through the test patterns; and a layout editor for identifying a physical location of the failure port in a layout of the integrated circuit through a relation between the hierarchical information and a floor plan report, and retrieving layout information of a routing path associated with the physical location of the failure port from a layout database.

11. The system of claim 10 wherein the tester outputs a test data log indicating at least one failure cycle of the test pattern.

12. The system of claim 11 wherein the diagnosis unit is installed with an automatic test pattern generation (ATPG) program for deriving the hierarchical information from the test data log.

13. The system of claim 12 wherein the hierarchical information is a pin path, which specifies a predetermined port of a gate without using coordinates.

14. The system of claim 13 wherein the diagnosis unit searches the floor plan report for generating coordinates of the failure port corresponding to the pin path.

15. The system of claim 14 wherein the floor plan report is of physical design exchange format (PDEF), library exchange format (LEF) or design exchange format (DEF).

16. The system of claim 10 wherein the layout database includes at least a file of a GDS II format.

17. The system of claim 10 further comprising a scanning electron microscope for verifying the failure port at the physical location on the integrated circuit.

18. A method for an integrated circuit manufacturer to identify a physical failure location on an integrated circuit without using layout-versus-schematic verification tools, the method comprising:
    testing the integrated circuit with one or more test patterns to identify a failure port thereon;
    generating hierarchical information of the failure port through the test patterns;
    identifying coordinates of a physical location for the failure port in a layout of the integrated circuit through a relation between the hierarchical information and a floor plan report;
    traversing a layout database to the coordinates of the physical location;
    generating a list of cells, whose boundaries covering the coordinates;
    selecting a standard cell from the list of cells, according to the hierarchical information;
    identifying the failure port in the standard cell; and
    generating layout information related to a routing with regard to the failure port in the layout of the integrated circuit.

19. The method of claim 18 wherein the testing comprises:
    inputting the test pattern into the integrated circuit; and
    outputting a test data log indicating at least one failure cycle of the test pattern.

20. The method of claim 19 wherein the generating hierarchical information comprises using an automatic test pattern generation (ATPG) program for deriving the hierarchical information from the test data log.

21. The method of claim 19 wherein the hierarchical information is a pin path, which specifies a predetermined port of a gate without using the coordinates.

22. The method of claim 21 wherein the floor plan report is of physical design exchange format (PDEF), library exchange format (LEF) or design exchange format (DEF).

23. The method of claim 18 wherein the layout database includes at least a file of a GDS II format.

24. The method of claim 18 further comprising verifying the failure port at the physical location on the integrated circuit, using a scanning electron microscope.

* * * * *